(12) United States Patent
Kim et al.

(10) Patent No.: US 8,432,761 B2
(45) Date of Patent: Apr. 30, 2013

(54) DATA BUS CONTROL SCHEME FOR AND IMAGE SENSOR AND IMAGE SENSOR INCLUDING THE SAME

(75) Inventors: Kyung-Min Kim, Suwon-si (KR);
Young-Kyun Jeong, Hwaseong-si (KR);
Hae-Sick Sul, Hwaseong-si (KR)

(73) Assignee: Samsung Electronics Co., Ltd, Suwon-si, Gyeonggi-do (KR)

( * ) Notice: Subject to any disclaimer, the term of this patent is extended or adjusted under 35 U.S.C. 154(b) by 893 days.

(21) Appl. No.: 12/458,989

(22) Filed: Jul. 29, 2009

(65) Prior Publication Data
US 2010/0060765 A1    Mar. 11, 2010

(30) Foreign Application Priority Data
Sep. 10, 2008 (KR) .................. 10-2008-0089384

(51) Int. Cl.
*G11C 7/00* (2006.01)
(52) U.S. Cl.
USPC ............. 365/203; 365/189.04; 365/230.06; 365/233.1

(58) Field of Classification Search .................. 365/203, 365/189.04, 230.06, 233, 233.1
See application file for complete search history.

(56) References Cited

U.S. PATENT DOCUMENTS

| | | | |
|---|---|---|---|
| 6,788,585 B1 * | 9/2004 | Eitrheim et al. | 365/189.04 |
| 7,142,446 B2 * | 11/2006 | Derner et al. | 365/149 |
| 7,234,034 B2 * | 6/2007 | Spriggs et al. | 711/167 |
| 7,656,732 B2 * | 2/2010 | Kuroda | 365/207 |
| 7,755,949 B2 * | 7/2010 | Rengarajan et al. | 365/185.25 |

* cited by examiner

*Primary Examiner* — Pho M Luu
(74) *Attorney, Agent, or Firm* — Lee & Morse, P.C.

(57) ABSTRACT

A memory system including a plurality of memory cells configured to receive digital signals includes an address decoder, a data bus, and a sense amplifier configured to receive data output from memory cells activated by addresses from the address decoder. The pre-charging the data bus and evaluating previous data by the sense amplifier occurs substantially simultaneously during a first period. The data bus and the sense amplifier are isolated from each other during the first period.

16 Claims, 15 Drawing Sheets

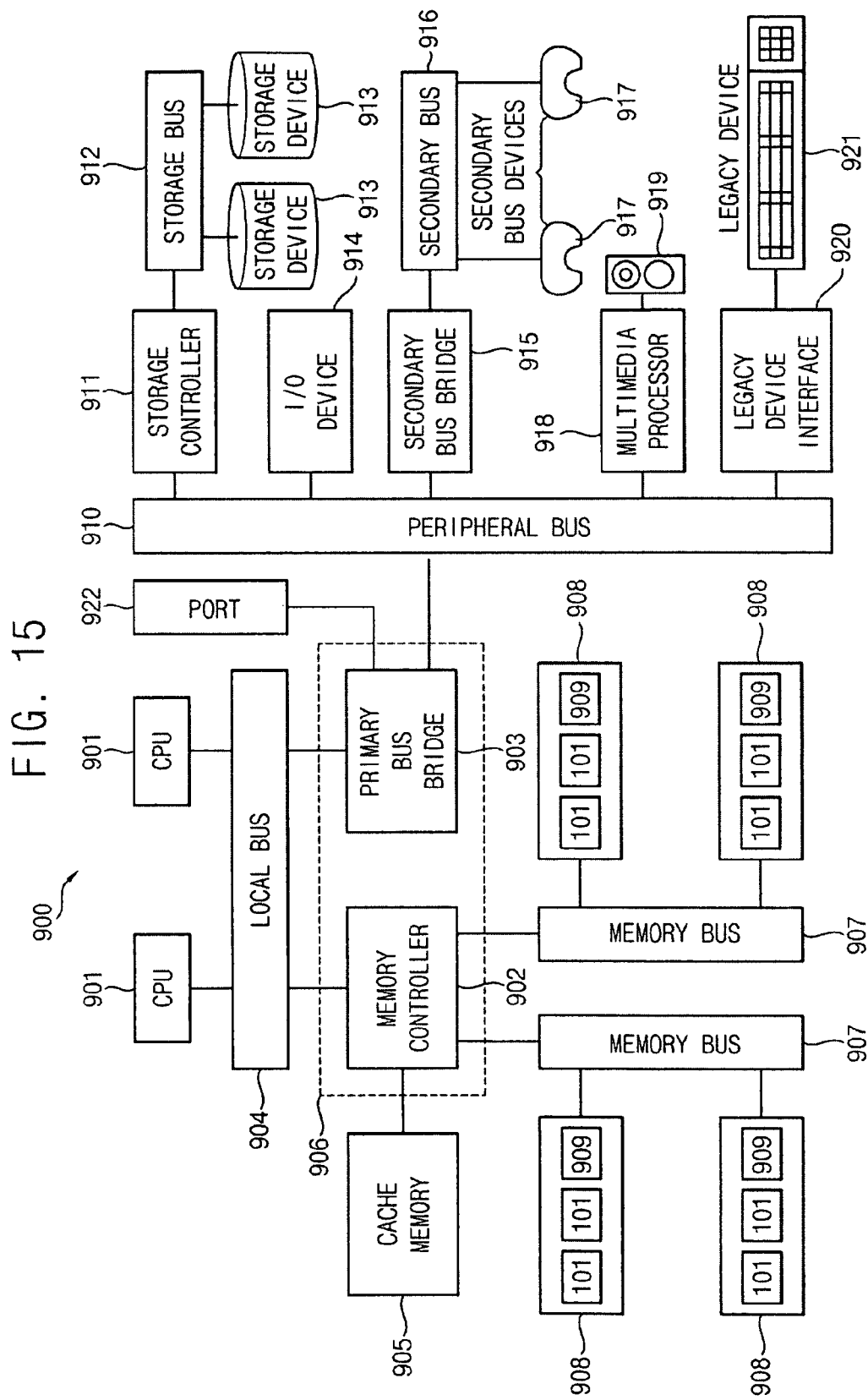

DATA BUS CONTROL SCHEME FOR AND IMAGE SENSOR AND IMAGE SENSOR INCLUDING THE SAME

BACKGROUND

1. Technical Field

Embodiments are directed to a data bus control scheme for an image sensor and an image sensor including the same.

2. Description of Related Art

High speed Data BUS (DBUS) are increasingly important for realizing high speed operation of integrated circuits (ICs). DBUS are used to serialize a digital signal to realize high speed analog to digital conversion (ADC). High speed ADC is needed to realize high resolution and high frame rate CMOS image sensor (CIS).

In a conventional system, a digital signal converted from analog signal is supplied to a memory array. Digital signals from the memory array are loaded on DBUS, which has been precharged to a predetermined voltage. Each cell of the memory array is activated by allocated address and the data from the activated cell is loaded onto DBUS. A sense amplifier senses and amplifies the data loaded in the DBUS. In such a system, one cycle includes three sequential operations, i.e., a DBUS precharge, data loading onto the DBUS from the activated memory cell, and evaluation, i.e., sensing/amplification. Additional circuitry is required to generate these control signals and a clock delay needs to be adjusted with variation in operational frequency.

SUMMARY

Embodiments are therefore directed to a subsampling method and apparatus, which substantially overcome one or more of the problems due to the limitations and disadvantages of the related art.

It is therefore a feature of an embodiment to provide a data transfer method and apparatus in which sensing/amplification (S/A) evaluation and DBUS precharging are executed in parallel.

It is another feature of an embodiment to provide a data transfer method and apparatus that reduces one cycle time in half compared to a conventional method.

It is yet another feature of an embodiment to provide a data transfer method and apparatus having an operational time that is twice as fast as a conventional method.

It is still another feature of an embodiment to provide a data transfer method and apparatus that eliminates idle time of sense amplifier It is yet a further feature of an embodiment to provide a data transfer method and apparatus that needs no adjustment of clock delay in accordance with the variation of operational frequency.

It is still a further feature of an embodiment to provide a data transfer method and apparatus that does not need additional circuits to generate complicated DBUS control signals.

It is yet another feature of an embodiment to provide a data transfer method and apparatus in which the data bus may maintain a certain value after evaluation sense amplifier, reducing a burden for a precharger.

It is still another feature of an embodiment to provide a data transfer method and apparatus that increase the efficiency in high frequency operation.

At least one of the above and other feature and advantages may be realized by providing a memory system including a plurality of memory cells configured to receive digital signals, the memory system including an address decoder, a data bus, and a sense amplifier configured to receive data output from memory cells activated by addresses from the address decoder, wherein pre-charging the data bus and evaluating previous data by the sense amplifier occurs substantially simultaneously during a first period, wherein the data bus and the sense amplifier are isolated from each other during the first period.

Loading data from activated memory cells to the data bus and evaluating current data by the sense amplifier occur substantially simultaneously.

The memory system may include a controller configured to isolate the data bus and the sense amplifier. The controller may include an amplifier and/or a switch. The controller may include a pre-charger configured to pre-charge the data bus. The sense amplifier may be stronger than a pre-charge amplifier of the pre-charger. The controller may be configured to buffer an output of the data bus to the sense amplifier. The controller may be configured to connect the sense amplifier and the data bus during addressing.

The memory system may include a functional block configured to alter a loading time during addressing.

At least one of the above and other feature and advantages may be realized by providing a method of transferring data from a memory cell to a sense amplifier via a data bus, the method including isolating the data bus from the sense amplifier, pre-charging the data bus, and evaluating, in the sense amplifier, previous data loaded from the data bus, evaluating substantially overlapping pre-charging.

The method may include addressing the data bus after pre-charging. The method may include loading data to the data bus during addressing, loading occurring during a non-overlapping clock of the sense amplifier. Loading and pre-charging may correspond to inverted clock signals. Loading and pre-charging may operate in response to opposite clocks having different periods. The method may include connecting the data bus to the sense amplifier during addressing.

The method may include controlling a speed of loading.

Precharging may occur for a longer period than evaluating.

At least one of the above and other feature and advantages may be realized by providing an image pick-up device, including a pixel array, an analog to digital converter configured to receive image data from the pixel array and to output corresponding digital signals, a memory array configured to store the digital signals output from the analog to digital converter, a data bus configured to be pre-charged and to load data from the memory array, a sense amplifier configured to receive data loaded in the data bus, to amplify the data, and to output amplified data, and an image signal processor configured to receive amplified data from the sense amplifier. Pre-charging the data bus and evaluating previous data by the sense amplifier occurs substantially simultaneously during a first period, the data bus and the sense amplifier being isolated from each other during the first period.

The image pick-up device may include a CMOS image sensor or a CCD. The CMOS image sensor may include a digital domain correlated double sampler or an analog domain correlated double sampler.

The image pick-up device may include a controller configured to isolate the data bus and the sense amplifier. The controller may include an amplifier and/or a switch. The controller may include a preamplifier. The sense amplifier may be stronger than the preamplifier. The controller may be configured to buffer an output of the data bus to the sense amplifier. The controller may be configured to connect the sense amplifier and the data bus during addressing.

The image pick-up device may include a functional block configured to alter a loading time during addressing.

At least one of the above and other feature and advantages may be realized by providing a machine-readable medium that provides executable instructions, which, when executed by a processor, cause the processor to perform a method of transferring data from a memory cell to a sense amplifier via a data bus, the method including isolating the data bus from the sense amplifier, pre-charging the data bus, and evaluating, in the sense amplifier, previous data loaded from the data bus, evaluating substantially overlapping pre-charging.

At least one of the above and other feature and advantages may be realized by providing a system, including a processor, a memory device in communication with the processor, and an image sensor in communication with at least one of the processor and the memory device. The image sensor may include a pixel array, an analog to digital converter configured to receive image data from the pixel array and to output corresponding digital signals, a memory array configured to store the digital signals output from the analog to digital converter, a data bus configured to be pre-charged and to load data from the memory array, a sense amplifier configured to receive data loaded in the data bus, to amplify the data, and to output amplified data, and an image signal processor configured to receive amplified data from the sense amplifier, wherein pre-charging the data bus and evaluating previous data by the sense amplifier occurs substantially simultaneously during a first period, wherein the data bus and the sense amplifier are isolated from each other during the first period.

BRIEF DESCRIPTION OF THE DRAWINGS

The above and other features and advantages of will become more apparent to those of ordinary skill in the art by describing in detail example embodiments with reference to the attached drawings in which:

FIG. 15 illustrates a block diagram of a processor system in accordance with an embodiment.

DETAILED DESCRIPTION

Korean Patent Application No. P2008-0089384, filed on Sep. 10, 2008, in the Korean Intellectual Property Office, and entitled: "Data output circuit and CIS including the same," is incorporated by reference herein in its entirety.

Figure 1:
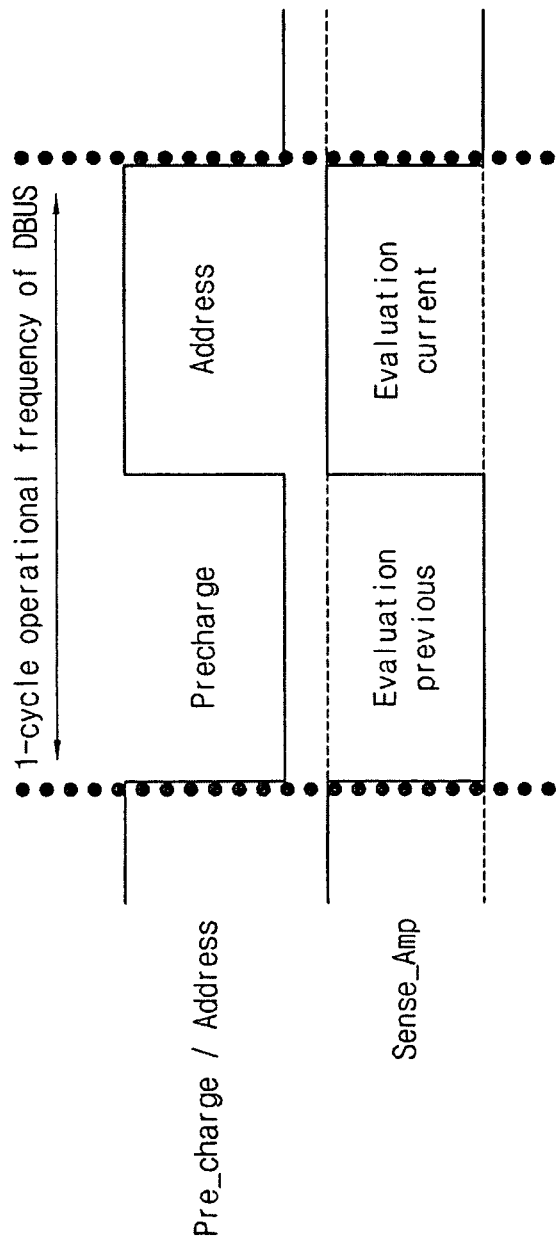
FIG. 1 illustrates a general timing diagram in accordance with an embodiment.

FIG. 1 illustrates a general timing diagram for data transfer between a memory array and a sense amplifier (S/A) using a data bus DBUS in accordance with an embodiment. As illustrated therein, one cycle may have two sequential operations, e.g., a first operation including simultaneous DBUS pre-charging and evaluation of previous data in the S/A and a second operation including loading data from a memory cell to the DBUS and evaluation of current data in the S/A. Conceptually, when the DBUS is in a precharging mode, the S/A is a data transfer mode and, when the DBUS is a data transfer mode, the S/A is being "precharged." During the first operation, i.e., the DBUS precharge and the S/A data transfer, the DBUS and the S/A are isolated from one another to allow parallel execution thereof. In the second operation, the DBUS and the S/A are connected.

As illustrated in FIG. 1, parallel execution of S/A evaluation and DBUS precharge may reduce one cycle time in half as compared to a non-parallel execution. In other words, operational time in accordance with embodiments may be up to twice as fast a non-parallel operational time. The idle time of the S/A may be eliminated. The clock delay may not require adjustment in accordance with the variation of operational frequency. Further, additional circuitry to generate DBUS control signal including, e.g., Pre-charge, Sense-Amp, etc., is not needed, as these may be generated from a clock signal.

Further, isolation between the DBUS and the S/A may allow the DBUS to be maintained at a certain voltage after evaluation of the S/A, decreasing a burden on a precharger to precharge the DBUS to a predetermined voltage. Thus, high frequency operation may be realized with increased efficiency, i.e., low total power consumption over one operational cycle.

As discussed in detail below with respect to various detailed embodiments, data transfer including parallel execution of DBUS precharging and S/A evaluation may be realized by isolating the DBUS and the S/A from each other.

Figure 2:
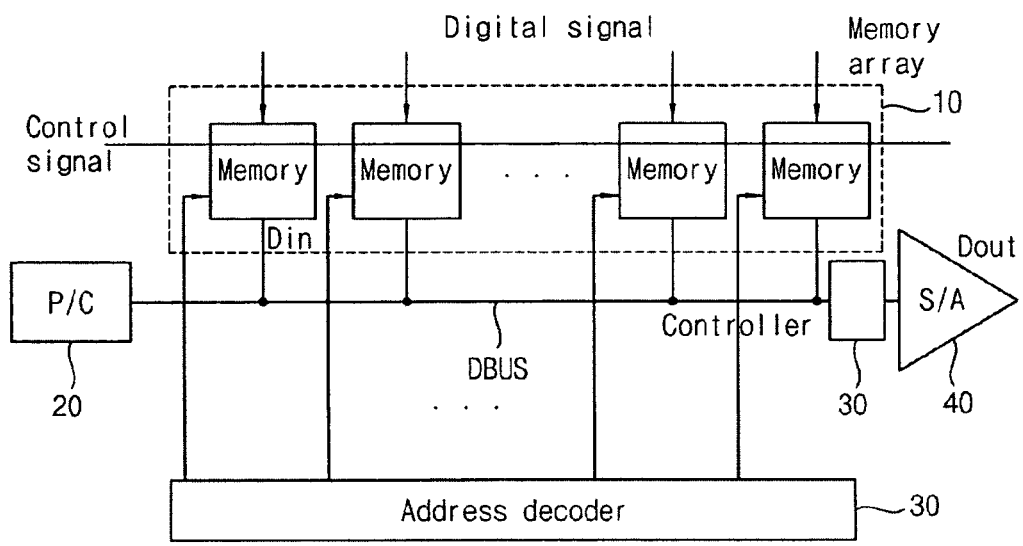
FIG. 2 illustrates a block diagram of a memory system in accordance with an embodiment.

FIG. 2 illustrates a block diagram of a general configuration of a memory system 5 in accordance with an embodiment. The memory system 5 may include a memory array 10, a precharger 20, a DBUS, a controller 30, a S/A 40 and an address decoder 50.

The memory array 10 may receive digital signals converted from analog signals and may store the digital signals in respective memory cells. These memory cells may be, for example, SRAM, DRAM, etc. The memory array 10 may load data from the memory cells onto the DBUS. The precharger 20 may precharge the DBUS to a predetermined voltage before operation in which a memory cell of the memory array 10 is activated by the address decoder 50 and data from the activated memory cell is loaded onto the DBUS in accordance with an external control signal. The S/A 40 may then evaluate the data loaded on the DBUS.

The controller 30 may isolate the DBUS and the S/A 40 physically and/or temporally, as will be described in more detail below. For example, the controller 30 may include a switch and/or a preamplifier. When just a preamplifier is used, the S/A should be stronger than a precharge amplifier. In addition to isolating the DBUS and the S/A 40, the controller 30 may also perform one or more additional operations, e.g., multiplexing, buffering, switching, amplifying, and so forth. By providing the controller 30 between the DBUS and the S/A 40, the precharging of the DBUS and the evaluation of the S/A 40 may be executed in parallel. Further, such isolation may allow the DBUS to be maintained at a certain value during after evaluation of the S/A 40, reducing a burden on the precharger 20.

Figure 3:
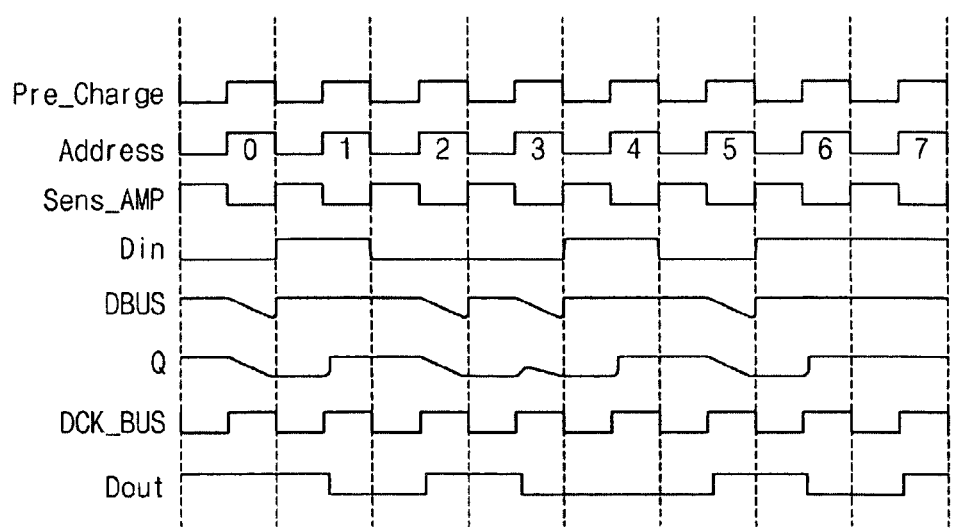
FIG. 3 illustrates a detailed timing diagram for data transfer in the memory system in FIG. 2.

In particular, as may be seen in the timing diagrams illustrated in FIG. 3, the precharger 20, which is active when a precharge control signal Pre_Charge is low, may be performed during a first half of an operational frequency of the DBUS. During this first half of the operational frequency of the DBUS, the S/A control signal Sens_AMP is high and the S/A 40 may evaluate previous data loaded from the DBUS. During a second half of the operational frequency of the DBUS, the DBUS may be loaded with data from a selected memory cell when the address control signal Address is high. When the S/A control signal Sens_AMP is low, the S/A 40 may evaluate current data from the DBUS during the second half of the operational frequency of the DBUS.

As may be seen in FIG. 3, a main clock signal DCK_bus, the precharge control signal Pre_Charge, and the address control signal Address may be the same, while the S/A control signal Sens_AMP may be complementary thereto. More particular configurations of the components of memory systems in accordance with embodiments will be discussed in detail below.

Figure 4:
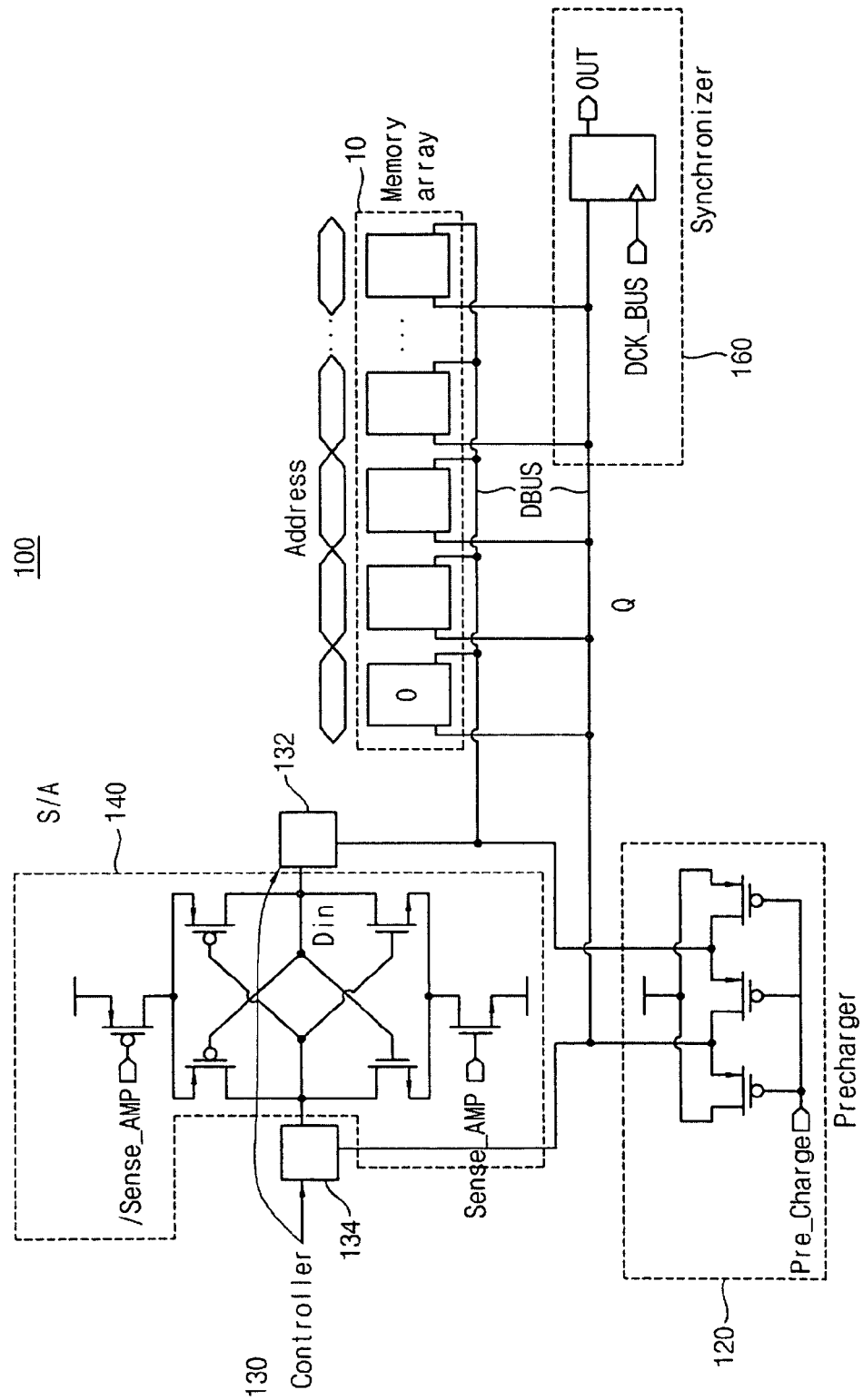
FIG. 4 illustrates a block diagram of a memory system in accordance with a first detailed embodiment.

FIG. 4 illustrates a block diagram of a memory system 100 in accordance with a first detailed embodiment. The memory system 100 may include the memory array 10, a precharger 120, a DBUS having two bus lines, a controller 130, a S/A 140 and a synchronizer 160.

The precharger 120 may include three transistors, here PMOS transistors, connected in series. Nodes between adjacent transistors and connected to electrodes thereof may be connected to respective bus lines of the DBUS. Outermost electrodes of the two outer PMOS transistors maybe connected to the high voltage VDD. Gate electrodes of the PMOS transistors may receive the precharge control signal Pre_Charge. As illustrated in FIG. 4, the precharger 120 may precharge the DBUS to the high voltage VDD. However, the precharger 120 may also precharge the DBUS to another voltage, e.g., ground, VDD/2, and so forth.

The S/A 140 may include cross-coupled pairs of PMOS and NMOS transistors controlled by a pair of enable signals Sense_AMP and /Sense_AMP. The /Sense_AMP signal may be input to the S/A 140 through another PMOS transistor that is also connected to a high voltage VDD. The Sense_AMP signal may be input to the S/A 140 through another NMOS transistor that is also connected to a low voltage VSS. When the S/A control signal Sens_AMP is high, i.e., during the first operation, the S/A 140 is isolated form the DBUS and the S/A 140 receives the high voltage VDD and the low voltage VSS to amplify and evaluate the previous data. When the S/A control signal Sens_AMP is low, i.e., during the second operation, the S/A 140 is cut off from the high and low voltages and is connected to the DBUS to receive and evaluate current data.

The controller 130 may include isolation element 132 and 134 positioned at terminals of the S/A 140. The synchronizer 160 may include a D flip-flop (DFF) that synchronizes the signal output from the S/A 140 with the master clock signal DCK_BUS. Here, the synchronizer 160 receives data output from the S/A 140 back through the DBUS.

Figure 5:
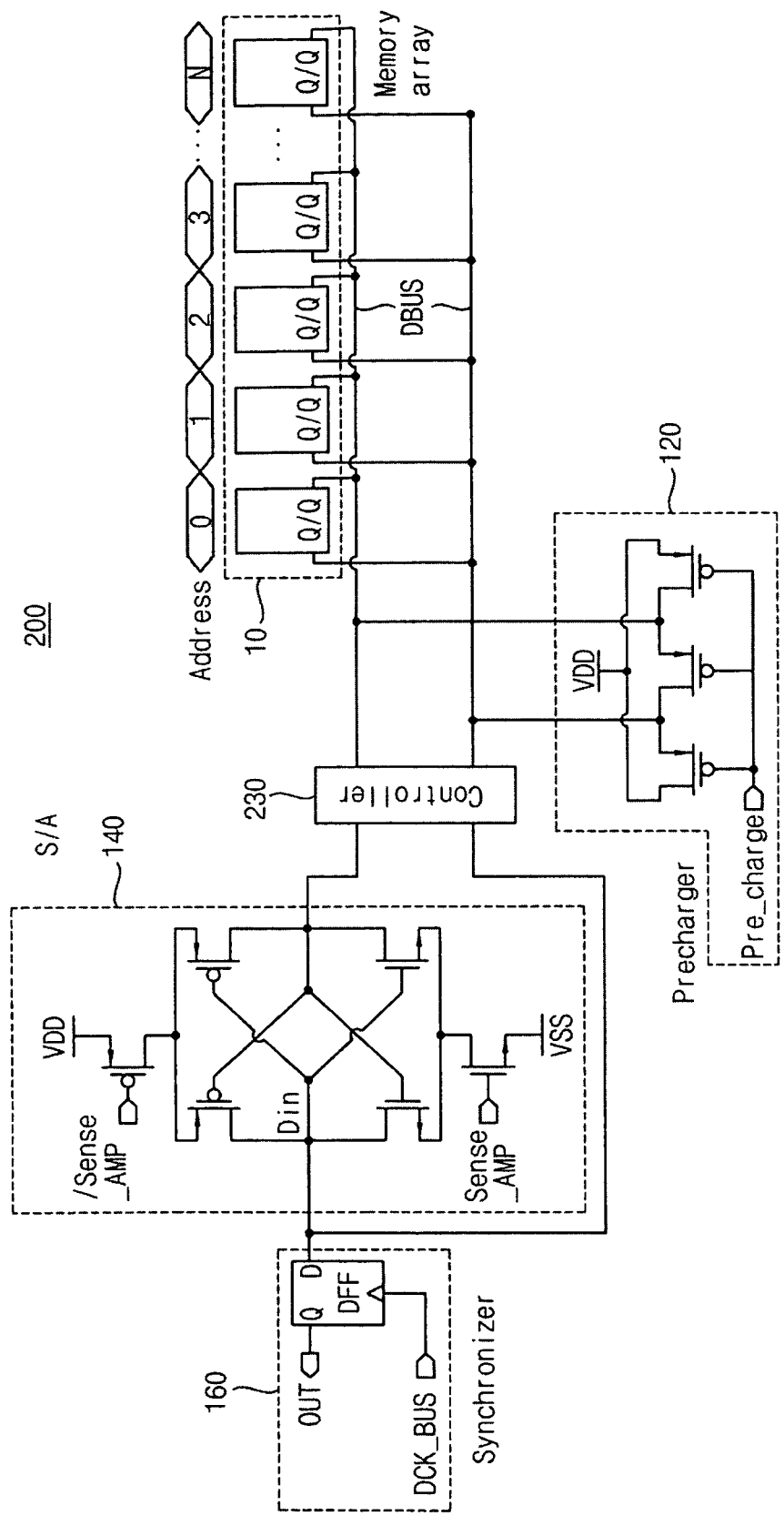
FIG. 5 illustrates a block diagram of a memory system in accordance with a second detailed embodiment.

FIG. 5 illustrates a block diagram of a memory system 200 in accordance with a second detailed embodiment. The memory system 200 may include the memory array 10, the precharger 120, a DBUS having two bus lines, a controller 230, the S/A 140, and the synchronizer 160. Only differences between FIGS. 4 and 5 will be described in detail.

As illustrated in FIG. 5, the synchronizer 160 may be connected directly to the terminal of the S/A 140, instead of through the DBUS as in FIG. 4. The controller 230 may still include two isolating elements, one for each of the terminals of the S/A 140, but may be provided on the same side, i.e., the DBUS side, of the S/A 140.

Figure 6:
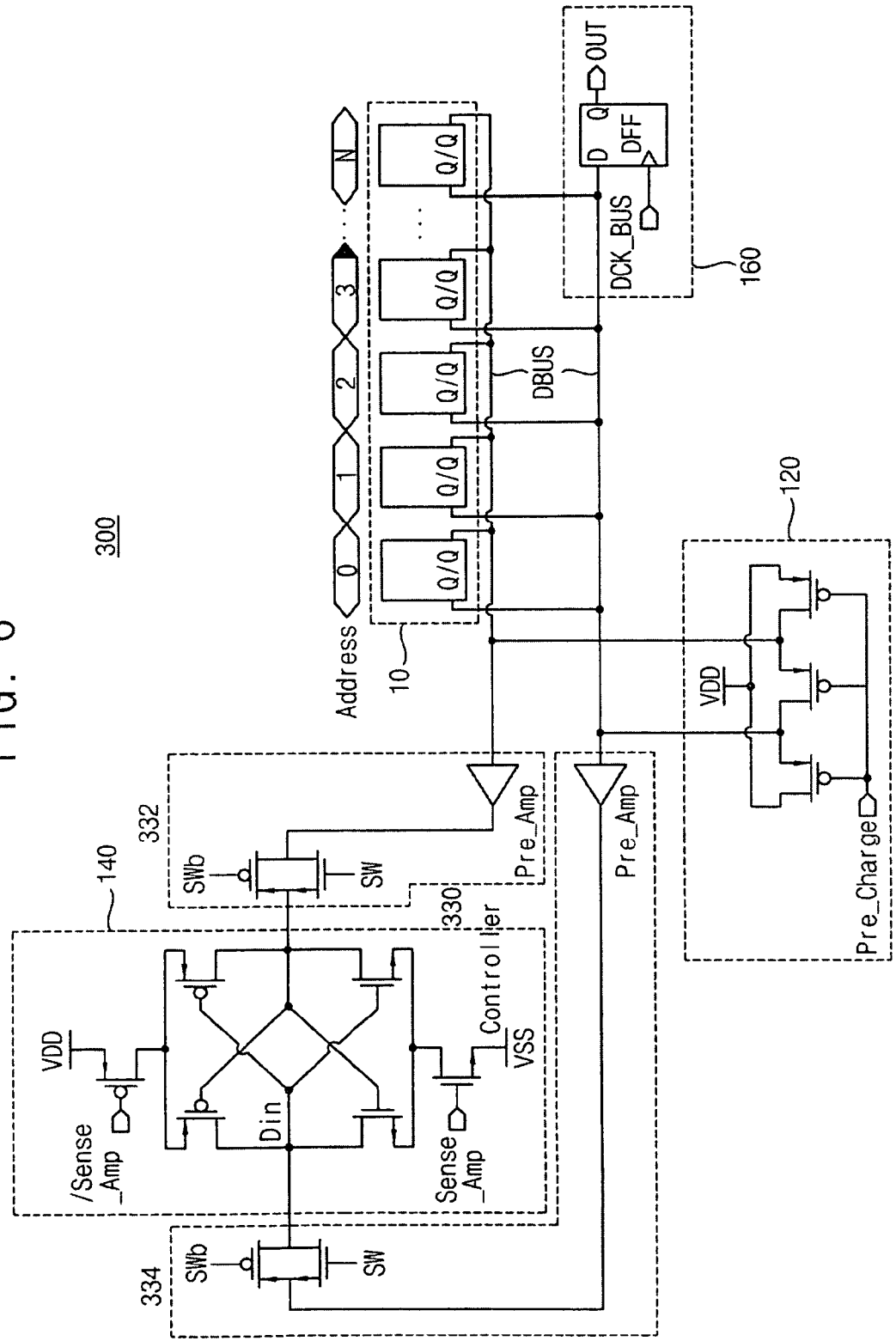
FIG. 6 illustrates a block diagram of a memory system in accordance with a third detailed embodiment.

FIG. 6 illustrates a block diagram of a memory system 300 in accordance with a third detailed embodiment. The memory system 300 may include the memory array 10, the precharger 120, a DBUS having two bus lines, a controller 330, the S/A 140, and the synchronizer 160. Only differences between FIGS. 4 and 6 will be described in detail.

The controller 330 may include first and second controlling units 332 and 334. Each of the first and second controlling units 332, 334 may include a preamplifier Pre_Amp and a pair of switches, here a NMOS transistor and PMOS transistor. Thus, the controller 330 may isolate, switch, and amplify signals. The NMOS and PMOS transistors may have drain electrodes connected to the preamplifier, source electrodes connected to terminals of the S/A 140, and gate electrodes receiving a switch signal SW and a complementary switch signal SWb, respectively. The switch signals may be supplied from an external source, e.g., a timing controller, a central processing unit (CPU), and so forth.

Figure 7:
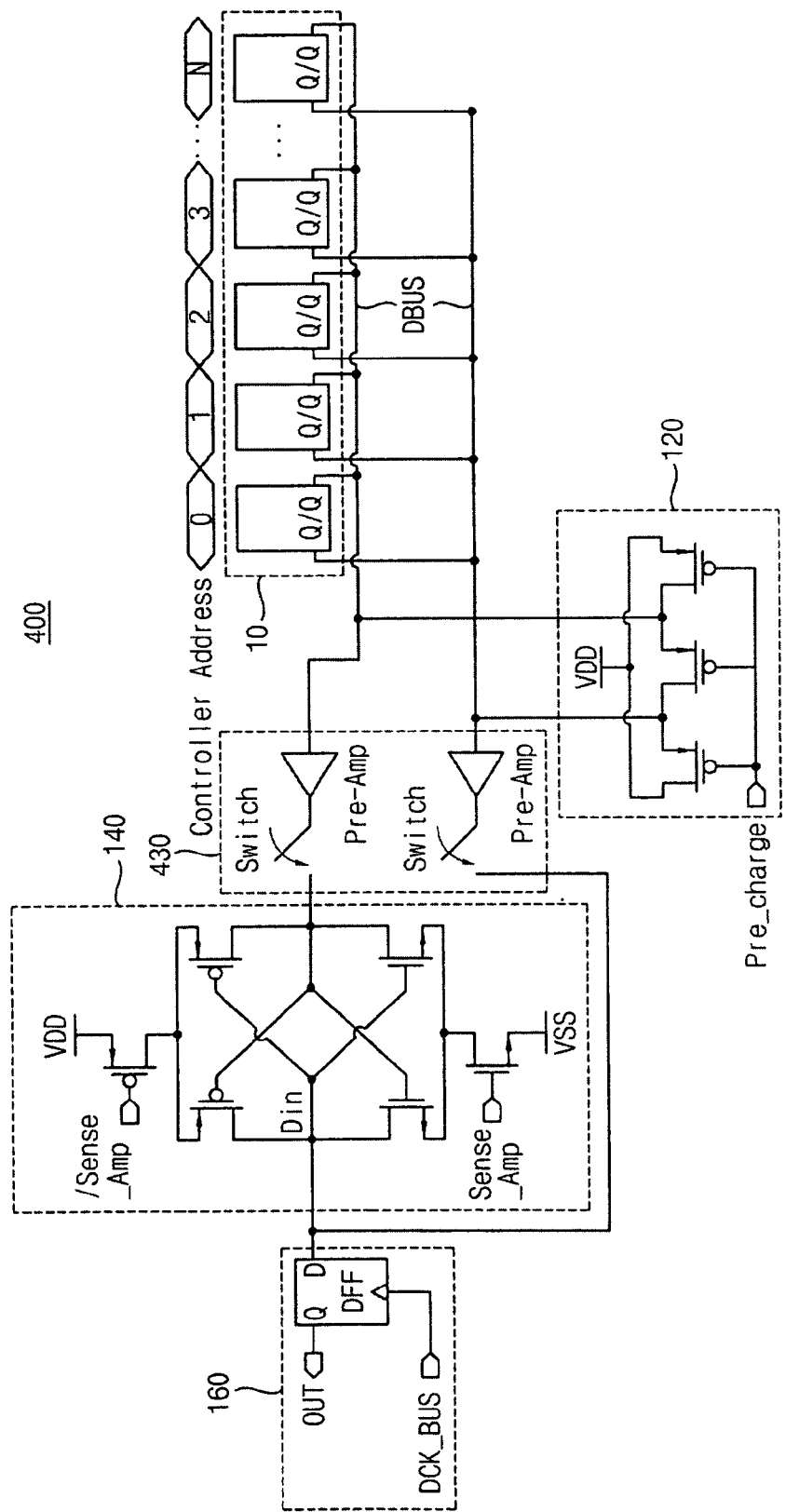
FIG. 7 illustrates a block diagram of a memory system in accordance with a fourth detailed embodiment.

FIG. 7 illustrates a block diagram of a memory system 400 in accordance with a fourth detailed embodiment. The memory system 400 may include the memory array 10, the precharger 120, a DBUS having two bus lines, a controller 430, the S/A 140 and the synchronizer 160. Only differences between FIGS. 5 and 7 will be described in detail.

The controller 430 may include a pair of preamplifiers Pre_Amp and a pair of switches. Thus, the controller 430 may isolate, switch and amplify signals.

Figure 8:
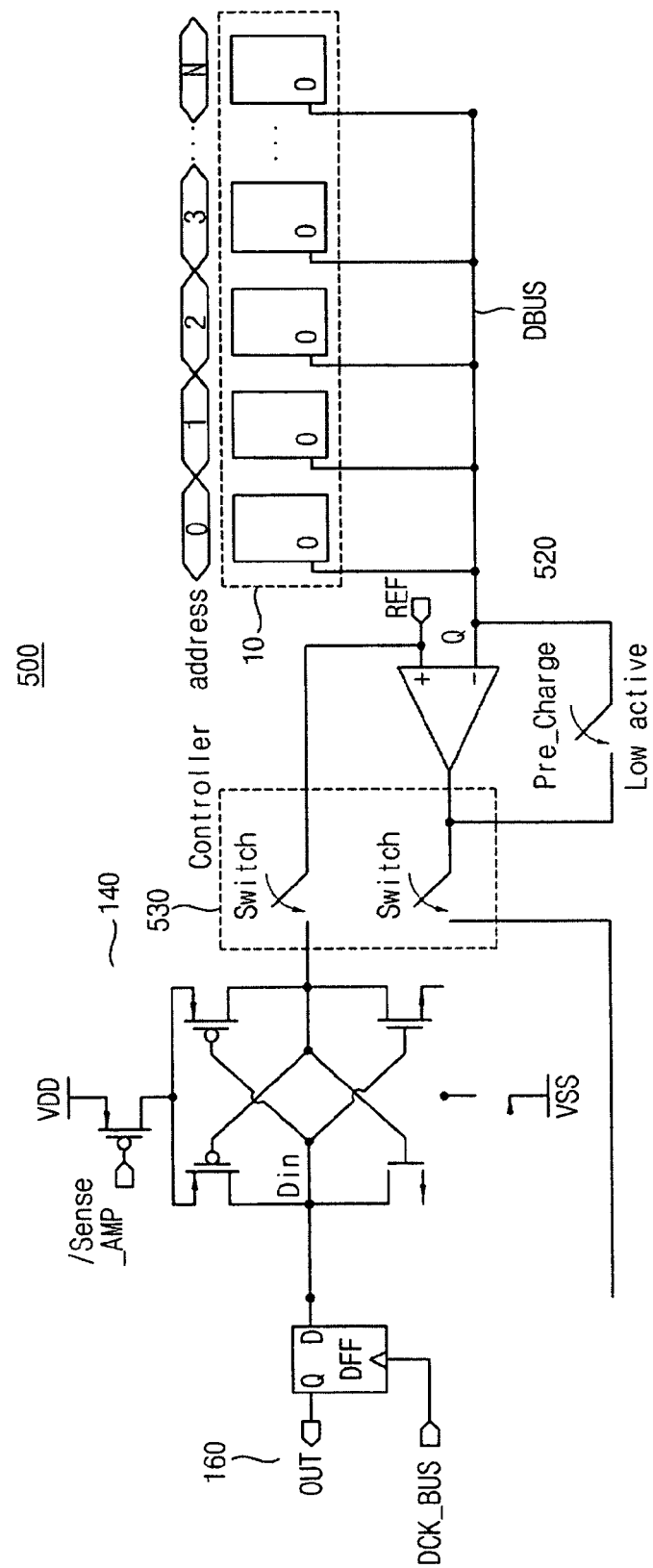
FIG. 8 illustrates a block diagram of a memory system in accordance with a fifth detailed embodiment.

FIG. 8 illustrates a block diagram of a memory system 500 in accordance with a fifth detailed embodiment. The memory system 500 may include the memory array 10, a precharger 520, a DBUS having a single bus line, a controller 530, the S/A 140 and the synchronizer 160. Only differences between FIGS. 5 and 8 will be described in detail. In FIG. 8, the DBUS has a single bus line and the precharger 520 may precharge the DBUS to half the high voltage VDD/2.

In FIG. 8, the precharger 520 may include a differential amplifier and a switch connected in parallel. The differential amplifier may receive Din or Q from the DBUS at a negative terminal thereof and a reference signal at a positive terminal thereof. The switch is turned on when the precharge control signal Pre_Charge is low.

The controller 530 may include a pair of switches, one switch being connected to the reference signal and the other switch being connected to the output of the precharger 520. The switches in the controller 530 may be on when the address control signal Address is high.

Figure 9:
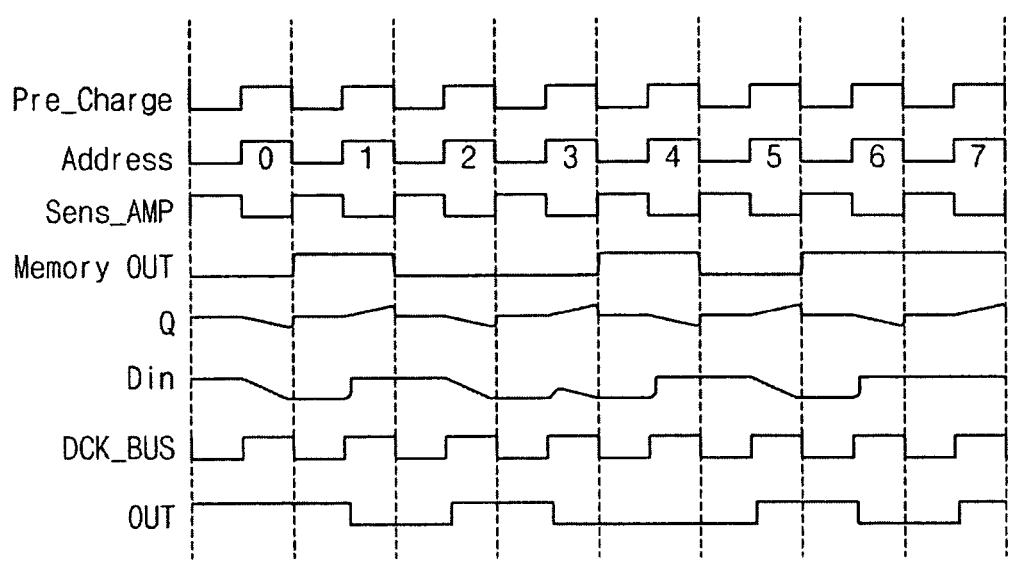
FIG. 9 illustrates a detailed timing diagram for data transfer in the memory system in FIG. 8.

FIG. 9 illustrates timing diagrams of the operation of the memory system 500, with the only difference from the timing diagrams FIG. 3 being the Q waveform.

Figure 10:
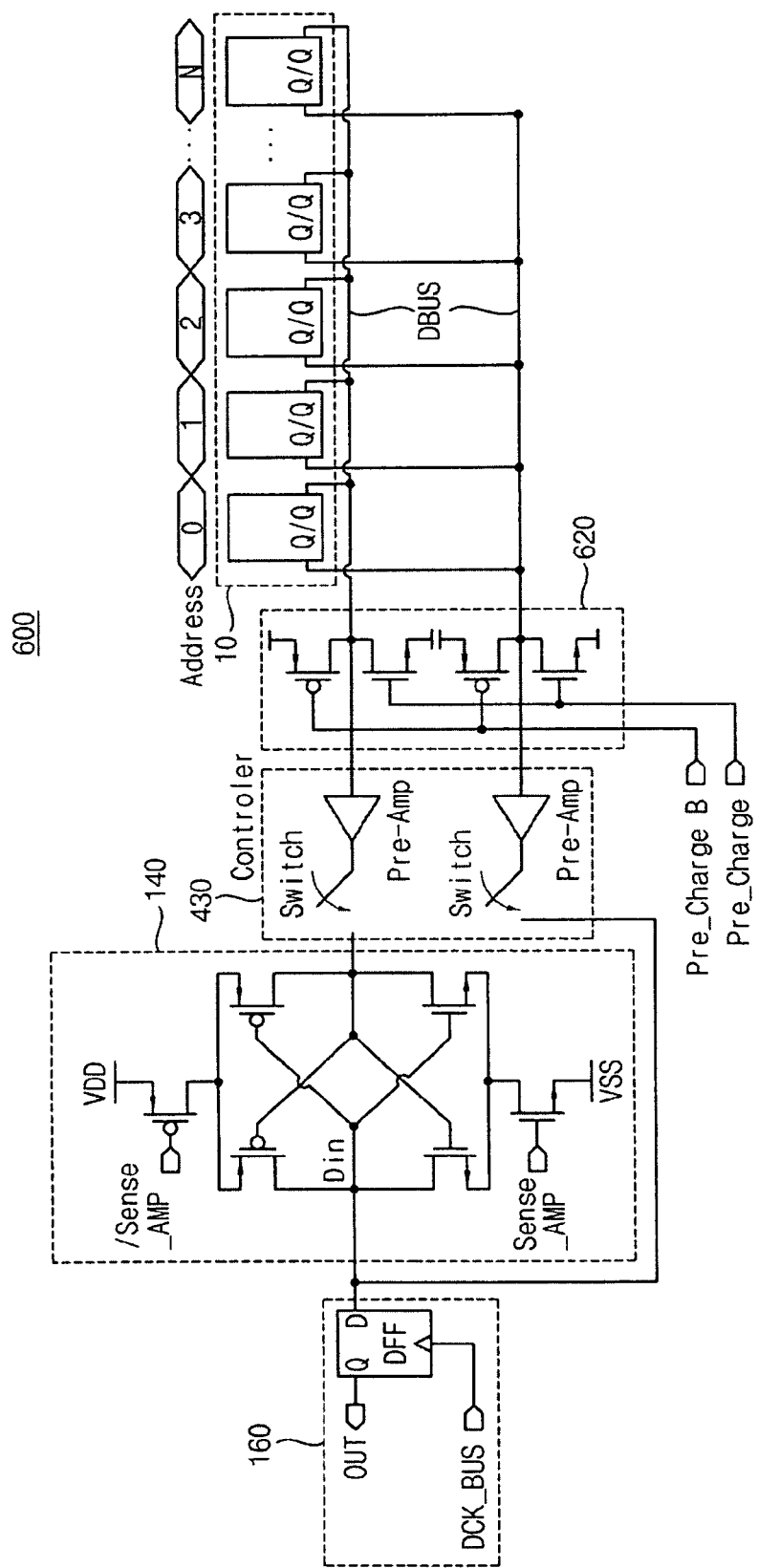
FIG. 10 illustrates a block diagram of a memory system in accordance with a sixth detailed embodiment.

FIG. 10 illustrates a block diagram of a memory system 600 in accordance with a sixth detailed embodiment. The memory system 600 may include the memory array 10, a precharger 620, a DBUS having two bus lines, the controller 430, the S/A 140 and the synchronizer 160. Only differences between FIGS. 4 and 10 will be described in detail. In FIG. 10, the precharger 120a may precharge the DBUS to half the high voltage VDD/2.

The precharger 620 may include two alternating PMOS and NMOS pairs connected in series separated by a capacitor. A first PMOS/NMOS pair may receive Q and a second PMOS/NMOS pair may receive /Q from the DBUS. Each PMOS transistor may receive a complementary precharge control signal Pre_Charge B and each NMOS may receive the precharge control signal Pre_Charge.

Figure 11:
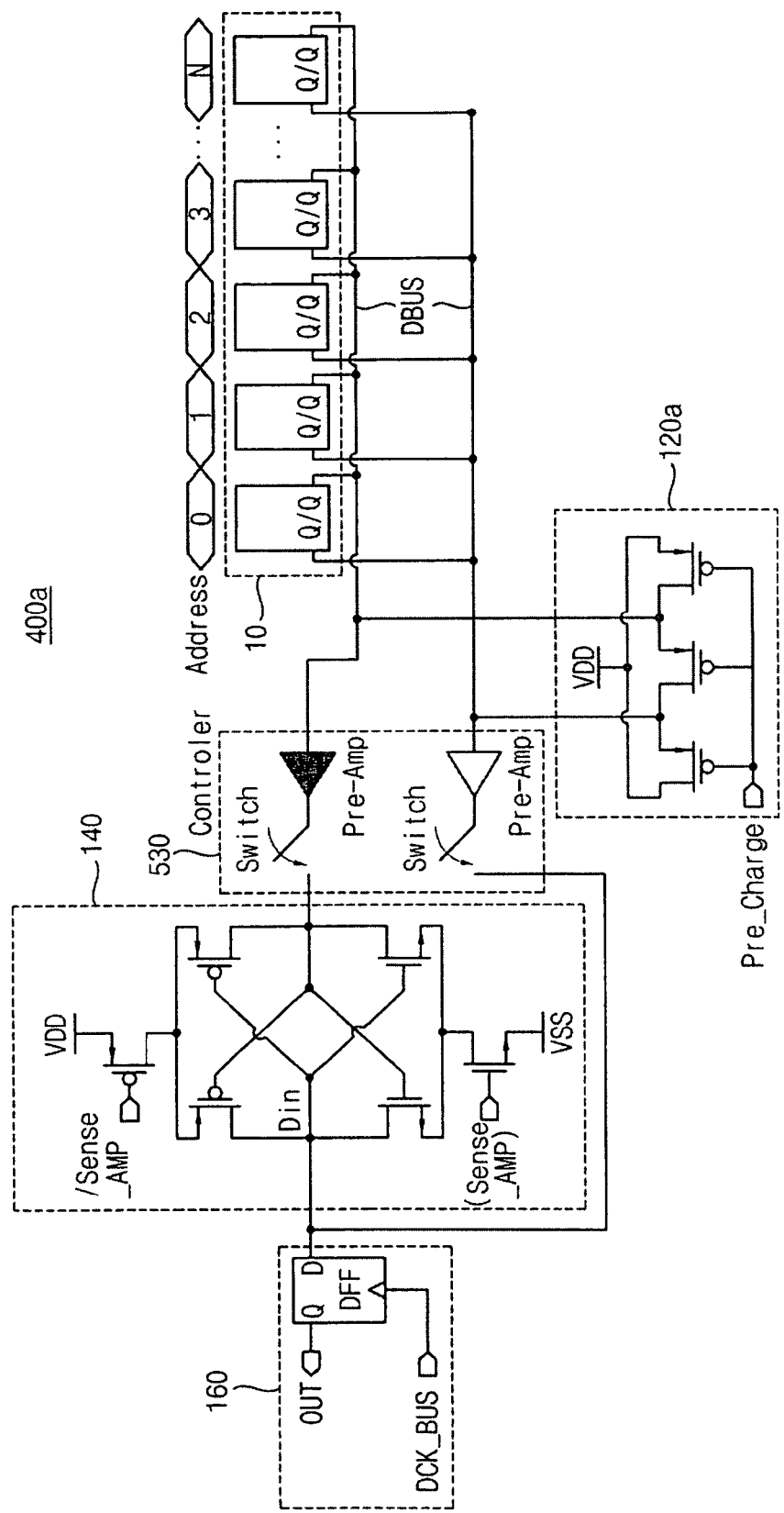
FIG. 11 illustrates a block diagram of a memory system in accordance with a seventh detailed embodiment.

FIG. 11 illustrates a block diagram of a memory system 400a in accordance with a seventh detailed embodiment. The memory system 400a may include the memory array 10, a precharger 120a, DBUS, the controller 530, the S/A 140 and the synchronizer 160. Only differences between FIGS. 4 and 11 will be described in detail. In FIG. 11, the precharger 120a receives the low voltage VSS rather than the high voltage VDD of the precharger 120a.

Thus, in accordance with embodiments, by isolating the DBUS and the S/A using various configurations, only two phases are needed for data transfer. In particular, during a first operation, the DBUS and the S/A may be isolated to allow parallel execution of precharging of the DBUS and evaluating of previous data by the S/A. During a second operation, the DBUS and the S/A may be connected to allow data transfer from the memory array to the S/A through the DBUS for evaluation of current data. While the precharging and data transfer period having been illustrated is being equal in embodiments, they may have different periods. For example, the precharge period, i.e., the first operation, may be longer than the data transfer period, i.e., the second operation.

Various applications of the memory system including data transfer operations according to embodiments are described in detail below. It is to be understood that the following applications are merely representative, not exhaustive.

Figure 12A:
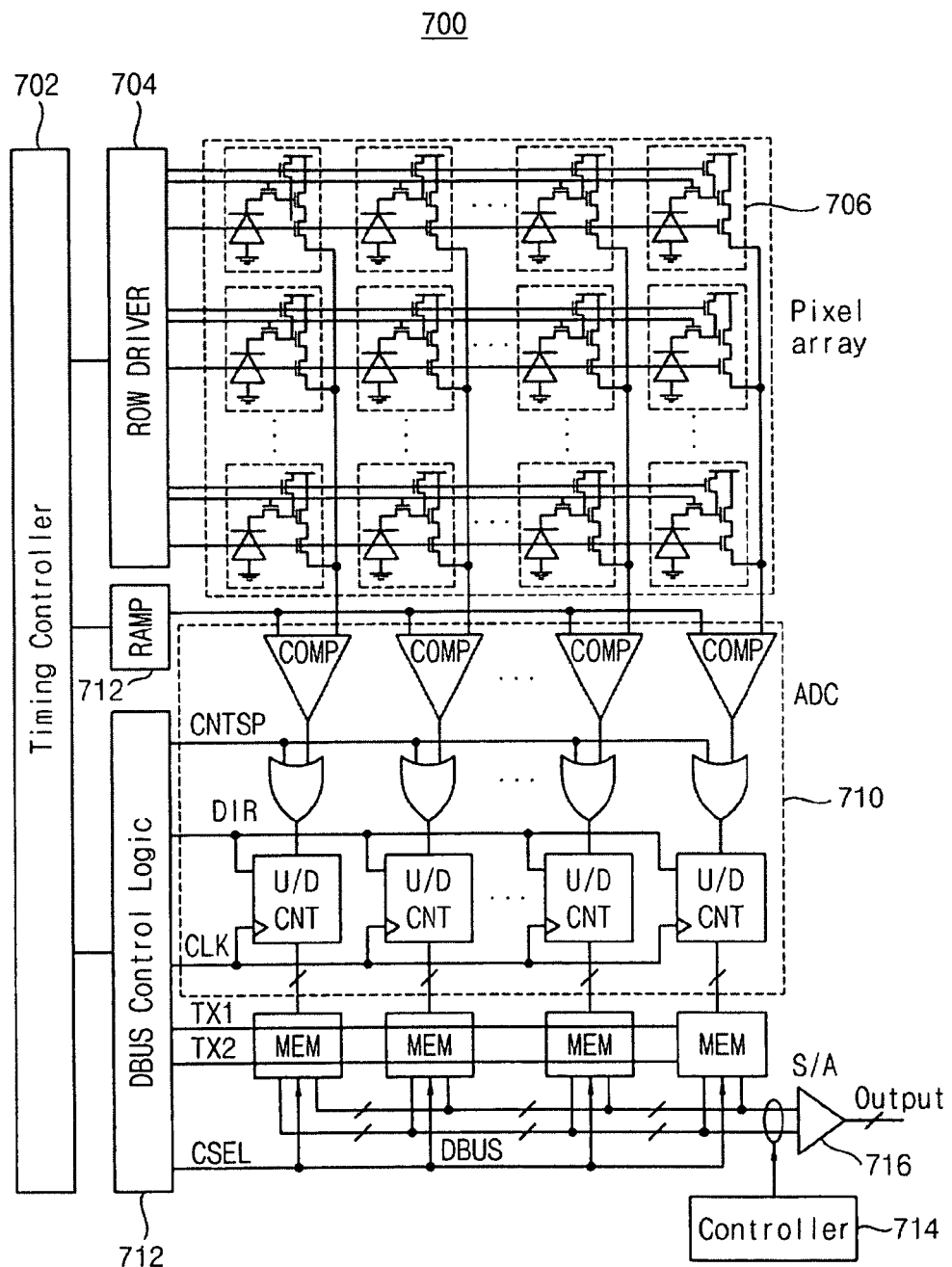
FIG. 12A illustrates a block diagram of a digital correlated double sampling image sensor in accordance with an embodiment.

FIG. 12A illustrates a block diagram of a digital correlated double sampling (CDS) CMOS image sensor 700 including a controller in accordance with embodiments. The CMOS image sensor 700 may include a timing controller 702, a row driver 704, a pixel array 706, e.g., an active pixel sensor (APS) array, a reference voltage generator 708, an ADC block 710, a DBUS control logic 712, a DBUS, a controller 714, and a S/A 716. In the CMOS image sensor 700, the CDS may be performed in the digital domain.

The ADC block 710 may include a plurality of unit ADCs, each including a comparator, an OR circuit, and an up/down counter. Each unit ADC may be connected to a memory cell. The DBUS control logic 712 may generate a plurality of control signals. In particular, the DBUS control logic 712 may output a countstop signal CNTSP to OR circuits of the ADC block 710, a direction signal DIR and a clock signal CLK to control operation of the counters in the ADC block 710, a memory read signal TX1, a memory hold signal TX2, and a column select signal CSEL to the memory cells. The memory cells output data to the DBUS, which, in turn transfers the data to the S/A 716 via the controller 714 in accordance with embodiments.

Figure 12B:
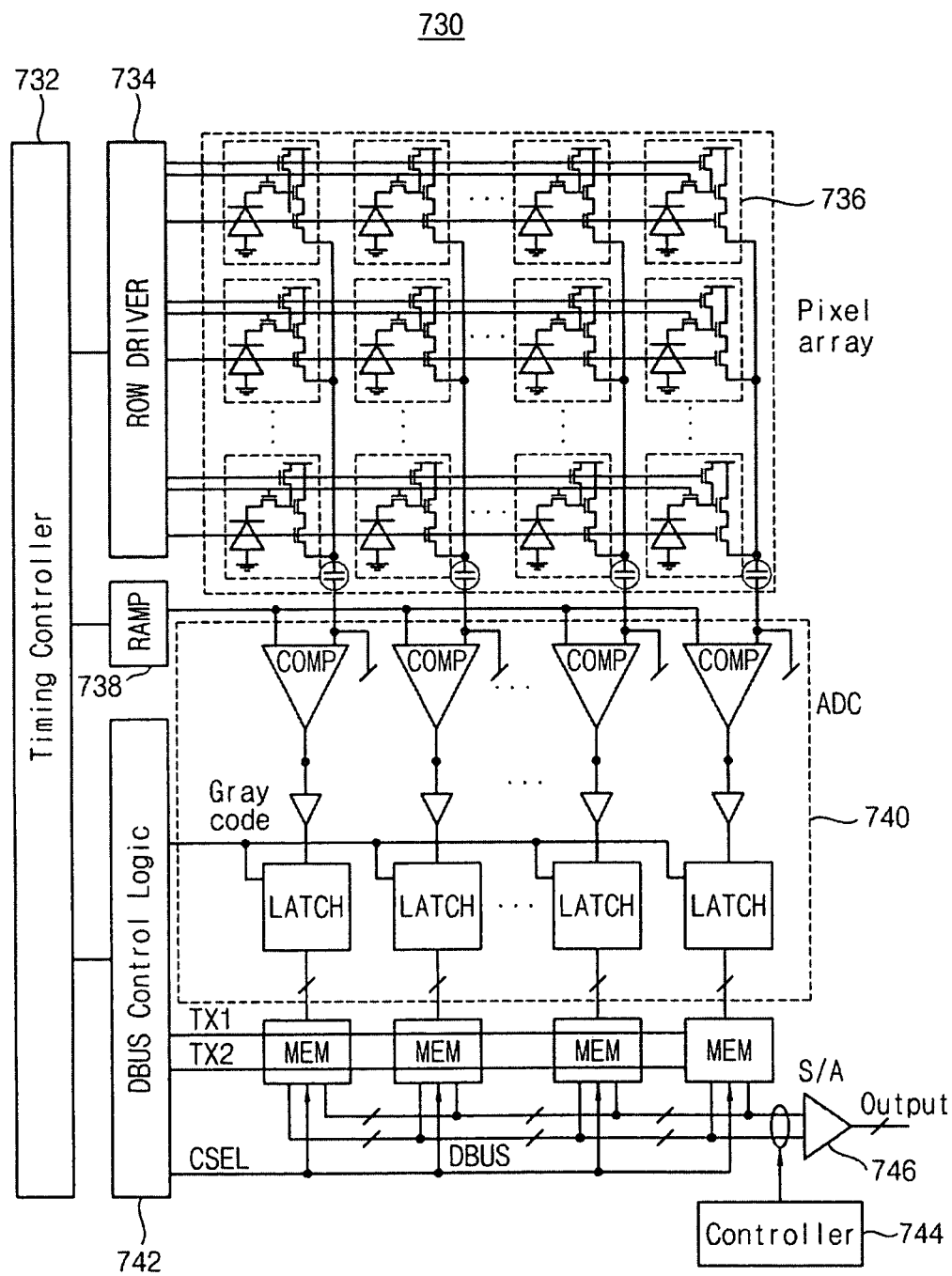
FIG. 12B illustrates a block diagram of an analog correlated double sampling image sensor in accordance with an embodiment.

FIG. 12B illustrates a block diagram of an analog CDS CMOS image sensor 730 including a controller in accordance with embodiments. The CMOS image sensor 730 may include a timing controller 732, a row driver 734, a pixel array 736, e.g., an active pixel sensor (APS) array, a reference voltage generator 738, an ADC block 740, a DBUS control logic 742, a DBUS, a controller 744, and a S/A 746. Here, the pixel array 736 may further include a capacitor in each column for realizing analog CDS.

The ADC block 740 may include a plurality of unit ADCs, each including a comparator, a preamplifier, and a latch. Each unit ADC may be connected to a memory cell. The DBUS controller 742 may generate a plurality of control signals. In particular, the DBUS controller 742 may output a gray code, which determines a digital value of the compared result, to the latches of the ADC block 740, and the memory read signal TX1, the memory hold signal TX2, and the column select signals to the memory cells. The memory cells output data to the DBUS, which, in turn transfers the data to the S/A 746 via the controller 744 in accordance with embodiments.

While the ADC blocks 710, 740 in FIGS. 12A and 12B are illustrated as a column parallel ADC, i.e., an ADC unit is arranged for each column, the ADC blocks may also be configured as a single ADC. The single ADC converts pixel signals output from all columns to digital signals using a single ADC. A CIS may employ either a column parallel ADC or a single ADC. When an image pick-up device includes a CCD, the single ADC should be used, as illustrated in FIG. 13.

Figure 13:
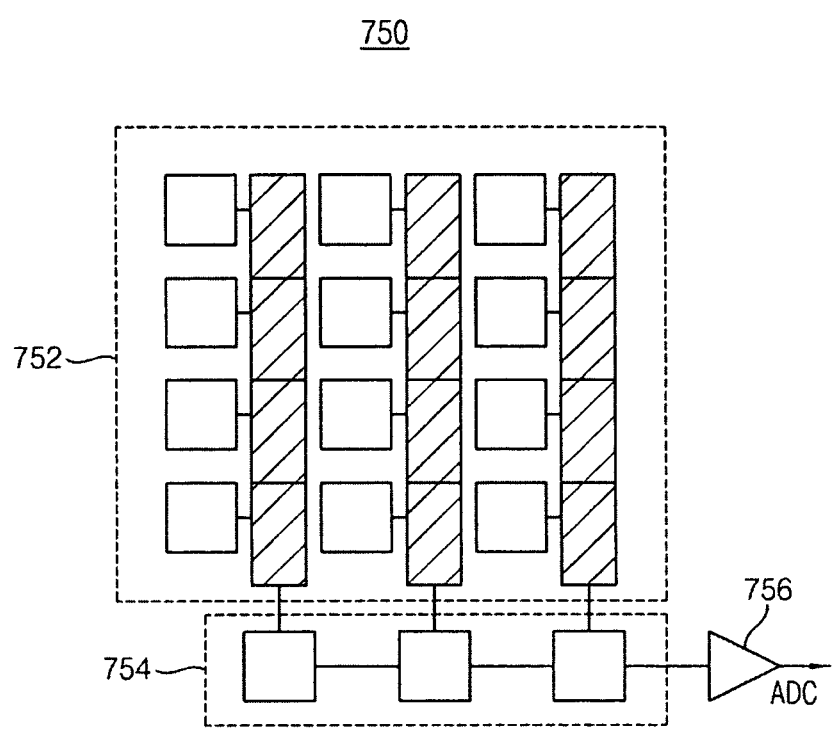
FIG. 13 illustrates a block diagram of an image pick-up device in accordance with an embodiment.

FIG. 13 illustrates a block diagram of an image sensor 750 which may include a pixel array 752, a sensor control circuit 754, and an output gate 756. The pixel array 752 may include CCD image sensors configured to output a plurality of signals within one frame. The sensor control circuit 754 may be configured to output the signals to a single ADC through the output gate 756. In the particular configuration illustrated in FIG. 13, the CCD uses interline data transfer, but other data transfer techniques, e.g., frame transfer and frame interline transfer, may be employed.

Figure 14:
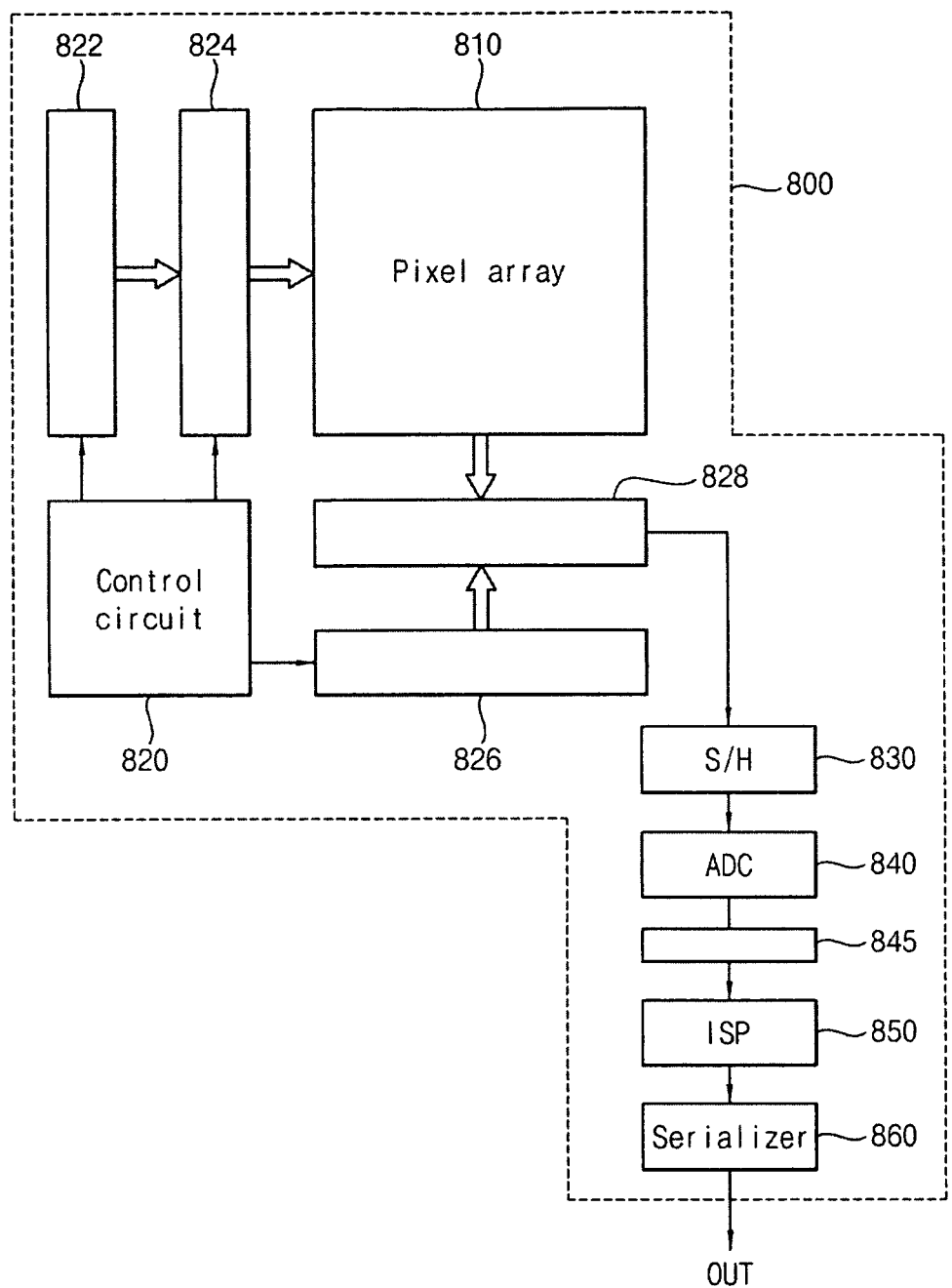
FIG. 14 illustrates a block diagram of an image pick-up device in accordance with an embodiment.

FIG. 14 illustrates a block diagram of an image pick-up apparatus 800 according to an embodiment. The image pick-up apparatus 800 may include a pixel array 810, a control circuit 820, a sample and hold (S/H) unit 830, an analog-to-digital converter (ADC) 840, an image signal processor (ISP) 850, a data transfer system 845 in accordance with embodiments, and a serializer 860.

The pixel array 810 may include a plurality of pixels arranged in a predetermined number of columns and rows. Pixels in each row may be turned on simultaneously, while pixels in each column may be selectively turned on.

The control circuit 820 may control an address decoder 822 and a column decoder 824 to select appropriate row and column lines for pixel readout. In response, a row driver 826 and a column driver/output 828 may apply driving voltages to drive transistors of selected row and column lines. Image data may then be output from the pixel array 810 from the selected column through the column driver/output 828 to the S/H unit 830. In turn, the S/H unit 830 may output the image data to the ADC 840.

The ADC 840 may output the image data to the memory system 845. The ISP 850, in which the image synthesizing may be performed, may receive digital image data from the memory system 845 in accordance with embodiments. This synthesized image data may then be output to the serializer 860.

FIG. 15 illustrates a block diagram of a processor system 900 in which embodiments may be employed. In particular, the processor system 900 may utilize the image pick-up device 800, which may be connected to a central processing unit (CPU) 901 or memory devices 100. The processor system 900 including the image pick-up device 800 may be, for example, Computer system/Camera system/Scanner/Machine vision system/Vehicle navigation system/video telephone/surveillance camera/Auto focus system/Star tracker system/Motion detection system/Image stabilization system/

Medical imaging device/Data compression system for high-definition television, and so forth.

The processor system 900 may include one or more CPUs 901 coupled to a local bus 904. A memory controller 902 and a primary bus bridge 903 may be coupled the local bus 904. The processor system 900 may include multiple memory controllers 902 and/or multiple primary bus bridges 903. The memory controller 902 and the primary bus bridge 903 may be integrated as a single device 906. The memory controller 902 may also be coupled to one or more memory buses 907.

Each memory bus may accept memory components 908, each of which may include at least one memory device 101. The memory components 908 may be a memory card or a memory module, e.g., single inline memory modules (SIMMs) and dual inline memory modules (DIMMs). The memory components 908 may include one or more additional devices 909, e.g., a configuration memory, such as a serial presence detect (SPD) memory.

The memory controller 902 may also be coupled to a cache memory 905. The cache memory 905 may be the only cache memory in the processing system 900. Alternatively, other devices, e.g., processors 901 may also include cache memories, which may form a cache hierarchy with cache memory 905.

If the processing system 900 includes peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge. 903 may be coupled to at least one peripheral bus 910. Various devices, such as peripherals or additional bus bridges, may be coupled to the peripheral bus 910. These devices may include a storage controller 911, a miscellaneous I/O device 914, a secondary bus bridge 915, a multimedia processor 918, and a legacy device interface 920. The primary bus bridge 903 may also coupled to one or more special purpose high speed ports 922. For example, when the processor system 900 is in a personal computer, the special purpose port 922 may be an accelerated graphics port (AGP), used to couple a high performance video card to the processor system 900.

The storage controller 911 may couple one or more storage devices 913, via a storage bus 912, to the peripheral bus 910. For example, the storage controller 911 may be a SCSI controller and storage devices 913 may be SCSI discs.

The I/O device 914 may be any sort of peripheral. For example, the I/O device 914 may be a local area network interface, such as an Ethernet card.

The secondary bus bridge 915 may be used to interface additional devices 917 via a secondary bus 916 to the processing system 900. For example, the secondary bus bridge 915 may be a universal serial port (USB) controller used to couple USB devices 917, including the image pick-up device 700, 730, 750 according to embodiments, to the processing system 900.

The multimedia processor 918 may be a sound card, a video capture card, or any other type of media interface, which may also be coupled to additional devices, e.g., such as speakers 919. The legacy device interface 920 may be used to couple legacy devices, for example, older styled keyboards and mice, to the processing system 900.

The processing system 900 illustrated in FIG. 15 is only an exemplary processing system with which embodiments may be used. While FIG. 15 illustrates a processing architecture especially suitable for a general purpose computer, such as a personal computer or a workstation, it should be recognized that well known modifications can be made to configure the processing system 900 to become more suitable for use in a variety of applications.

For example, many electronic devices, which require processing may be implemented using a simpler architecture, which relies on a CPU 901, coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders.

The modifications may include, for example, elimination of unnecessary components, addition of specialized devices or circuits, and/or integration of a plurality of devices.

Exemplary embodiments have been disclosed herein, and although specific terms are employed, they are used and are to be interpreted in a generic and descriptive sense only and not for purpose of limitation. For example, the data transfer according to embodiments may be implemented in software, e.g., by an article of manufacture having a machine-accessible medium including data that, when accessed by a machine, cause the machine to transfer data. Accordingly, it will be understood by those of ordinary skill in the art that various changes in form and details may be made without departing from the spirit and scope of the present invention as set forth in the following claims.

What is claimed is:

1. A memory system including a plurality of memory cells configured to receive digital signals, the memory system comprising:
    an address decoder;
    a data bus;
    a sense amplifier configured to receive data output from memory cells activated by addresses from the address decoder, wherein pre-charging the data bus and evaluating previous data by the sense amplifier occurs substantially simultaneously during a first period, wherein the data bus and the sense amplifier are isolated from each other during the first period; and
    a functional block configured to alter a loading time during addressing.

2. The memory system as claimed in claim 1, wherein loading data from activated memory cells to the data bus and evaluating current data by the sense amplifier occur substantially simultaneously.

3. The memory system as claimed in claim 1, further comprising a controller configured to isolate the data bus and the sense amplifier.

4. The memory system as claimed in claim 3, wherein the controller comprises an amplifier.

5. The memory system as claimed in claim 4, wherein the controller comprises a switch.

6. The memory system as claimed in claim 3, wherein the controller includes a preamplifier.

7. The memory system as claimed in claim 6, wherein the sense amplifier is stronger the preamplifier.

8. The memory system as claimed in claim 3, wherein the controller is configured to buffer an output of the data bus to the sense amplifier.

9. The memory system as claimed in claim 3, wherein the controller is configured to connect the sense amplifier and the data bus during addressing.

10. A method of transferring data from a memory cell to a sense amplifier via a data bus, the method comprising:

isolating the data bus from the sense amplifier;
pre-charging the data bus;
evaluating, in the sense amplifier, previous data loaded from the data bus, evaluating substantially overlapping pre-charging;
loading data to the data bus during addressing, loading occurring during a non-overlapping clock of the sense amplifier; and
altering a loading time during addressing.

11. The method as claimed in claim 10, further comprising addressing the data bus after pre-charging.

12. The method as claimed in claim 11, further comprising connecting the data bus to the sense amplifier during addressing.

13. The method as claimed in claim 10, wherein loading and pre-charging correspond to inverted clock signals.

14. The method as claimed in claim 10, wherein loading and pre-charging operate in response to opposite clocks having different periods.

15. The method as claimed in claim 10, further comprising controlling a speed of loading.

16. The method as claimed in claim 10, wherein precharging occurs for a longer period than evaluating.

* * * * *